United States Patent [19]

Batcher

[11] 4,249,171

[45] Feb. 3, 1981

[54] VECTOR DISPLAY SCOPE

[75] Inventor: Alfred J. Batcher, Clawson, Mich.

[73] Assignee: Sun Electric Corporation, Crystal Lake, Ill.

[21] Appl. No.: 75,526

[22] Filed: Sep. 12, 1979

[51] Int. Cl.³ .............................................. G08B 5/36
[52] U.S. Cl. ..................................... 340/722; 73/465;
324/121 R; 340/727; 340/793; 364/521
[58] Field of Search ...................... 73/465; 324/121 R;
364/521; 340/722, 727, 793

[56] References Cited

U.S. PATENT DOCUMENTS

| | | | |
|---|---|---|---|
| 3,336,587 | 8/1967 | Brown | 340/793 X |
| 3,554,061 | 1/1971 | Holdinghausen | 73/465 X |
| 3,925,765 | 12/1975 | Berwin et al. | 340/727 X |
| 3,959,582 | 5/1976 | Law et al. | 364/521 X |
| 4,127,850 | 11/1978 | Vallins | 340/727 X |
| 4,135,203 | 1/1979 | Friedman | 324/121 R |
| 4,168,488 | 9/1979 | Evans | 340/146.3 MA |

*Primary Examiner*—David L. Trafton
*Attorney, Agent, or Firm*—Allegretti, Newitt, Witcoff & McAndrews

[57] ABSTRACT

A cathode-ray oscilloscope controlled by a circuitry receiving four (4) voltage inputs representative of the Cartesian coordinates of endpoints of two (2) vectors, for visually displaying the vectors in the form of a dashed line segment and a solid line segment. The circuity responds to operator input for generating display signals to rotate the two displayed vectors with respect to the CRT screen and responds to internal control for blinking the display of either of the vectors according to a preset vector magnitude limit.

9 Claims, 10 Drawing Figures

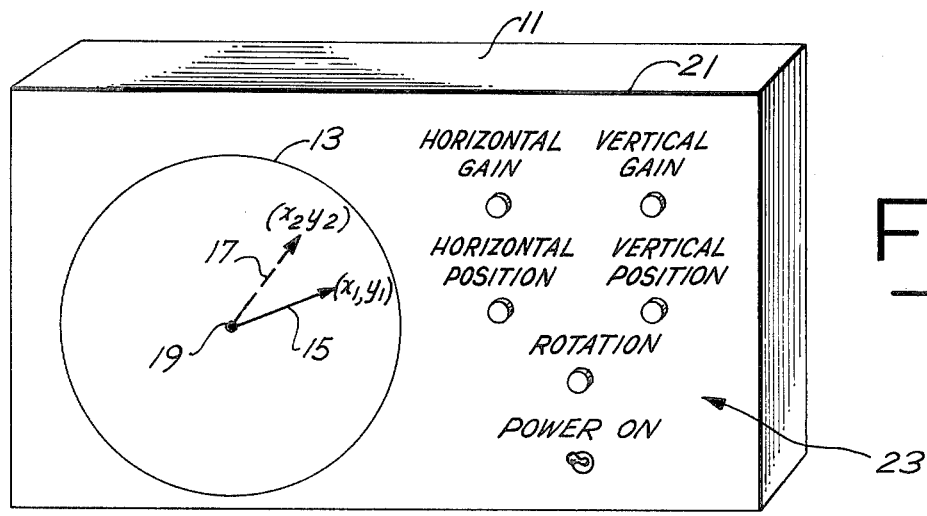
Fig. 1
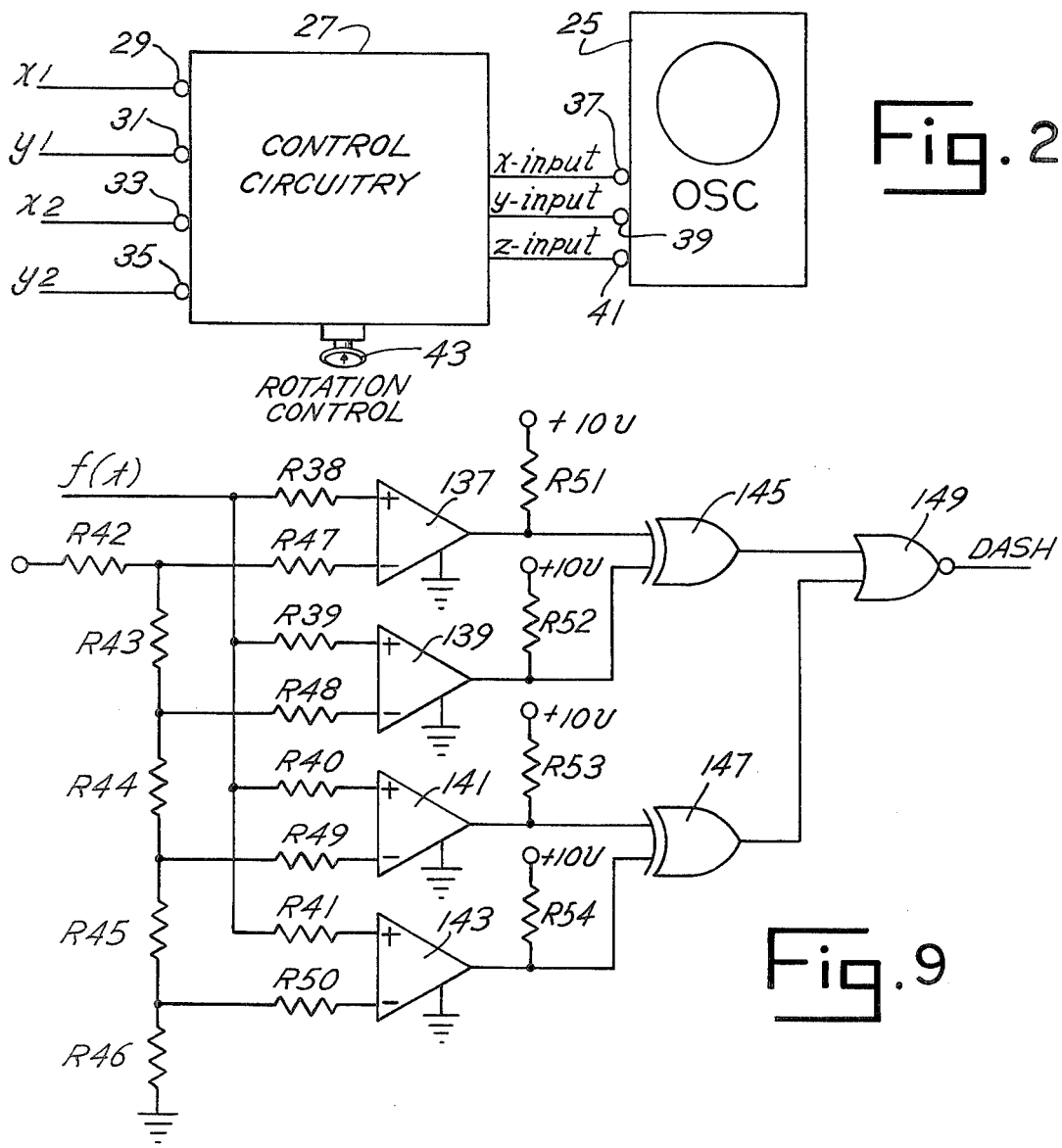
Fig. 2
Fig. 9

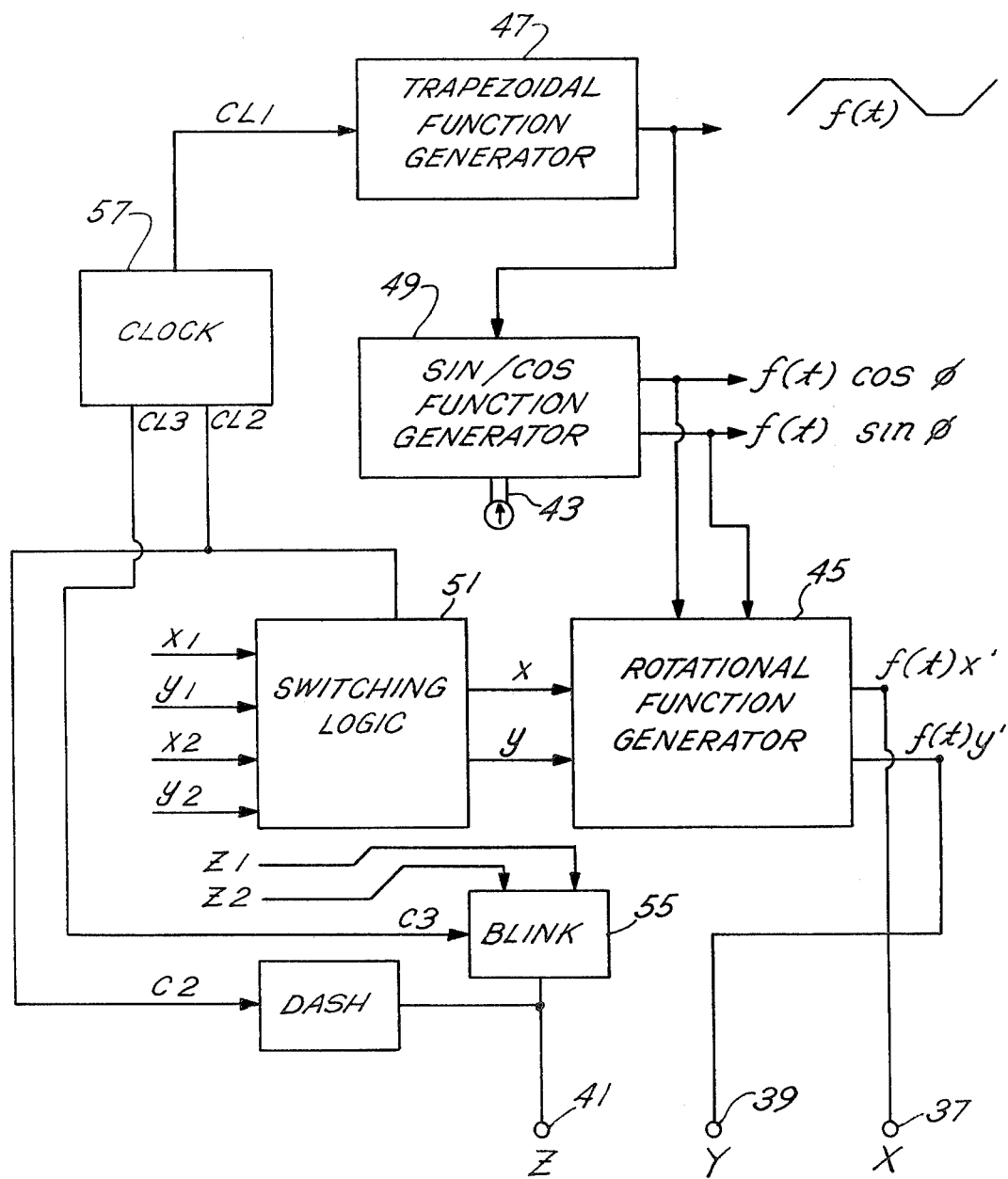

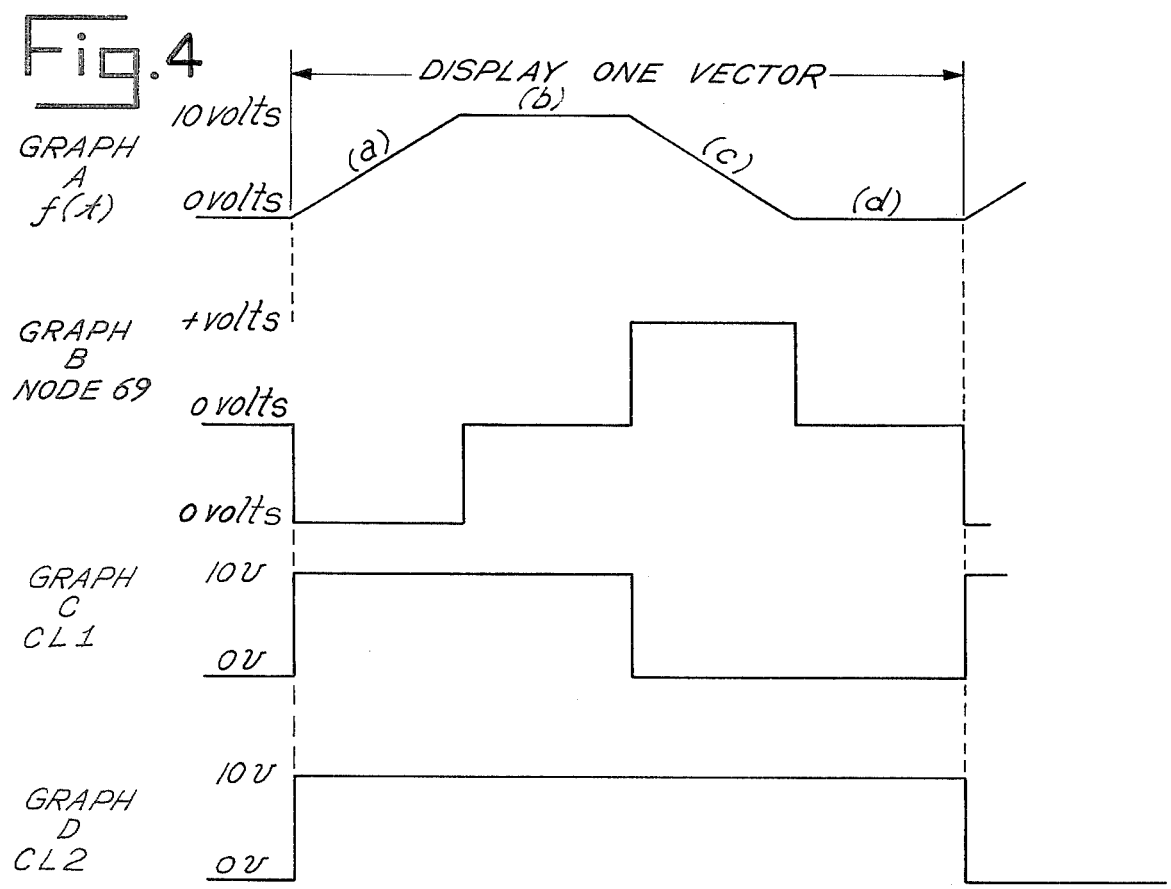
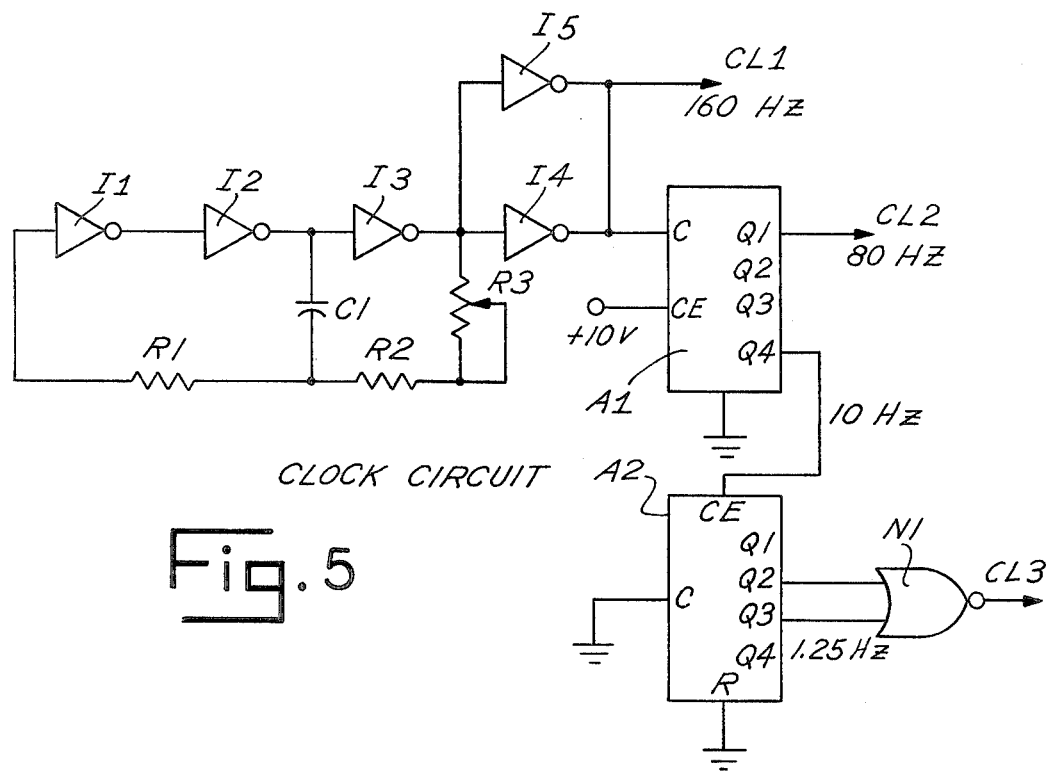

VECTOR DISPLAY SCOPE

BACKGROUND OF THE INVENTION

The invention relates to display devices for visually displaying vector representations, and more particularly, relates to a display device for visually displaying a pair of imbalance force vectors representative of forces monitored by a pair of imbalance transducers positioned at discrete locations on an automotive engine.

An imbalance force, as well as other vector-type stimulus, carries information of a magnitude and a direction in space. When testing imbalance of automotive engines, a pair of conventional transducers are positioned at separate locations on the automotive engine for generating electrical signals indicative of the imbalance forces occurring at those locations.

Heretofore, separate analog meters have been used to determine the magnitude of the imbalance force at each location, and separate rotation synchros have been utilized to monitor the angular information of the force at the monitored locations. It would be highly desirable to provide a device which would display the magnitude and direction of each imbalance force in a vector form on a display screen for permitting ease of interpretation of the forces.

SUMMARY OF THE INVENTION

It is therefore, an object of the present invention to provide a display apparatus for visually displaying a vector representation of a magnitude and direction of a monitored stimulus, as for example: an imbalance force.

It is a further object of the invention to provide control circuitry for a display apparatus for differentiating the displays of different vectors.

It is still another object of this invention to provide an internal control for visually indicating to the operator when the magnitude of either of the displayed vectors exceeds a preset limit.

These and other objects of the invention are achieved by an electrical circuit responsive to a pair of voltages representative of the magnitude of the Cartesian coordinates identifying a direction and magnitude of a stimulus, for converting the same to input display signals providing information to a display device for visually displaying a vector representation. The vector display is rotatable on its display screen by operator control which responsively affects the display signals for rotating the displayed vectors accordingly.

Circuitry is disclosed for use with displaying a plurality of vectors, for dashing a line segment of a vector for differentiation thereof with respect to another vector being displayed.

Further, circuitry is disclosed for monitoring the magnitude of the vector and responsively blinking the displayed vector when the magnitude of the vector exceeds a predetermined limit.

BRIEF DESCRIPTION OF THE FIGURES

FIG. 1 is a perspective view of the display screen and operator controls of a preferred embodiment of the vector display scope.

FIG. 2 is a block diagram of the preferred embodiment of the control circuitry and the display device of FIG. 1.

FIG. 3 is a block diagram of a preferred arrangement of the control circuitry of FIG. 2.

FIG. 4 is a timing diagram of various signals of the control circuitry of FIG. 3.

FIG. 5 is a preferred embodiment of the clock circuitry of the control circuitry of FIG. 3.

FIG. 9 is a preferred embodiment of the dash generator of the control circuitry of FIG. 3.

DESCRIPTION OF THE PREFERRED EMBODIMENT

Figure 6:
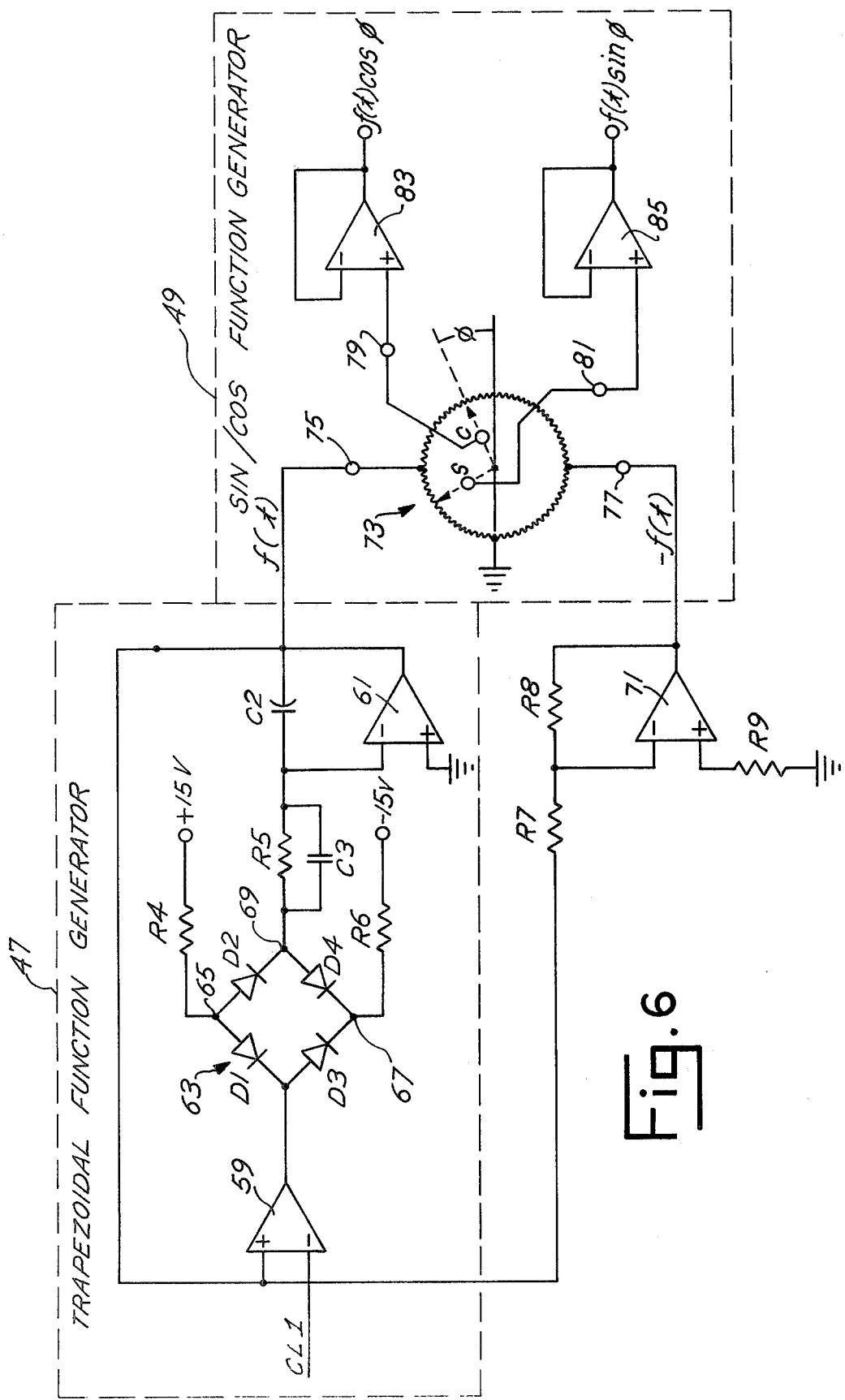
FIG. 6 is a preferred embodiment of a trapezoidal function generator and sin/cos function generator of the control circuitry of FIG. 3.

Referring to FIG. 1, a vector display scope 11 includes a display screen 13 for visually displaying two vectors 15, 17 emanating from the same origin point 19. Vector 15 is solid, whereas, vector 17 is composed of three dashes. A front panel 21 is provided including a plurality of operator controls 23 for scaling, shifting and rotating of the two vectors as desired by the operator.

As illustrated in FIG. 2, display scope 11 comprises a conventional cathode-ray oscilloscope 25 together with a control circuitry 27 which is described in detail with reference to FIGS. 3–10. Control circuitry 27 generates input signals to oscilloscope 25 for displaying the two vectors 15, 17 which are represented by two ordered pairs of Cartesian coordinates, $(x_1, y_1)$ and $(x_2, y_2)$. A voltage representative of the magnitude of each coordinate is fed to control circuitry 27 via voltage inputs 29, 31, 33, 35.

Control circuitry 27 develops signals at an x-input 37, a y-input 39 and a z-input 41 of oscilloscope 25 for displaying vector 15 as a solid line and vector 17 as a dashed line. As will be understood, the voltage appearing at z-input 41 controls the intensity of the oscilloscope's cathode-ray beam, whereas the voltages at x-input 37 and y-input 39 control the horizontal and vertical deflection, respectively, of the beam with respect to the display face of the cathode-ray tube.

A rotational control 43 is provided to permit the operator to rotate the displayed vectors about their origin point by effectively adjusting the output signals fed to inputs 37, 39. An internal control is also provided for causing either vector to blink on and off for signaling the operator that the magnitude of a displayed vector exceeds a preset limit.

Referring to FIG. 3, control circuitry 27 includes a rotational function generator 45 which provides output signals to inputs 37, 39 of oscilloscope 25 for controlling deflection of the oscilloscope beam for tracing out the two vectors. Rotational function generator 45 formulates the output signals responsive to a trapezoidal function generator 47, a sin/cos function generator 49 and a switching logic 51. A dash circuit 53 and a blink circuit 55 are included in circuitry 27 for generating signals to input 41 of the oscilloscope for dashing the display of one of the vectors and for providing a blinking display to either of the vectors. The timing of circuitry 27 is controlled by three (3) clock signals CL1, CL2 and CL3, generated by a clock circuit 57.

The inputs to circuitry 27 are four (4) voltage signals defining two coordinate points $(x_1, y_1)$ and $(x_2, y_2)$. In order to display a line segment connecting the origin point (0, 0) with the two points defined by the four (4) voltage inputs, a time dependent sweep signal is generated for deflecting the cathode-ray beam in a straight line between the points.

The sweep signal is generated by trapezoidal function generator 47 for generating a time dependent signal f(t) having a trapezoidal wave shape, as illustrated in Graph A of FIG. 4. During the ramp-up portion (a) of the trapezoidal waveform, the line segment of the vector is traced out on the oscilloscope display from the origin to the end point of the vector. At the top portion (b) of the waveform, the sweep beam is held at the vector end point (x, y). During the ramp-down portion (c) of the waveform, the vector is retraced from end point of the vector to the origin, and on the lower portion (d) of the waveform, the sweep beam is held at the origin point. Because the sweep beam is held at the origin point and vector end point for a period of time, the points are more clearly defined permitting accurate visual interpretation of the display.

Sin/cos function generator 49 is utilized for generating a cosine signal and a sine signal which are functionally related to an angle $\phi$. $\phi$ is the angle of rotation of the displayed vector 15, 17, which is manually selectable by the operator via control knob 43.

When rotating a vector about its origin in an x-y plane, the new coordinates for a rotated vector are given by:

$$x' = x \cos \phi - y \sin \phi$$

$$y' = x \sin \phi + y \cos \phi$$

where:
(x, y) is the vector before rotation;
(x', y') is the vector after rotation; and
$\phi$ is the angle of rotation.

Rotational function generator 45 performs a rotational transformation of the vectors by generating the x' and y' signals. The x' and y' signals are multiplied by the sweep signal f(t) for providing a time varying signal to sweep the vector display on oscilliscope 25.

In the preferred embodiment, the signal f(t) is fed as an input to sin/cos function generator 49 for producing output signals of f(t)·cos $\phi$ and f(t)·sin $\phi$. As will be appreciated, the signal f(t) may be fed directly to rotational function generator 45 together with sine and cosine signals from generator 49 for formulating the output signals of f(t) x' and f(t) y'.

The output signals from sin/cos function generator 49 are transmitted to rotational function generator 45, together with input signals of an x-y pair of coordinate voltages. The rotational transformation signals f(t) x' and f(t) y' are generated and fed respectively to the x-input 37 and y-input 39 of oscilloscope 25.

Switching logic 51 is controlled by clock signal CL2, for successively transmitting one pair of coordinate voltages to rotational function generator 45. As understood, the oscillscope displays each vector, one at a time, from the signals appearing at inputs 37, 39, but does so at a high rate of speed so that the human eye perceives two displayed vectors.

The clock signal CL2 is also fed to dash circuit 53 for producing a voltage signal at the intensity input 41 of the oscilloscope. Dash circuit 53 serves to blot the intensity of the oscilloscope in segmented periods during the output of one pair of the vector display signals appearing at inputs 37, 39, for displaying one of the vectors in a dashed form.

Blink circuit 55 also provides a voltage signal at intensity input 41 for commanding one or both displayed vectors to blink. A pair of signals $Z_1$, $Z_2$ are fed to blink circuit 55 and represent the magnitude of respective vectors $(x_1, y_1)$ and $(x_2, y_2)$. As understood, the magnitude Z is defined according to the equation:

$$Z = \sqrt{x^2 + y^2} .$$

$Z_1$ and $Z_2$ may be generated by conventional apparatus and fed as inputs to control circuitry 27.

The control circuitry of FIG. 3 will now be described in greater detail with reference to a preferred embodiment as illustrated in FIGS. 5–10. A preferred clock circuit 57 is illustrated in a preferred form in FIG. 5, as including inverters I1–I5, resistors R1–R3, capacitor C1, counter-dividers A1–A2 and NOR gate N1, connected as shown. Clock signal CL1 is generated as a substantially square waveform of 160 hertz. Counter-divider A1 divides CL1 to half its frequency for generating CL2 at 80 hertz. A 10 hertz signal is also divided from CL1 at counter-divider A1 and fed to counter-divider A2 for producing a 1.25 hertz signal at the Q3 output of divider A2.

NOR gate N1 receives the Q2 and Q3 outputs of divider A2 for generating CL3 which is a signal logically high ¾ of a period and logically low ¼ of the period. CL3 controls blink circuit 55 and, therefore, will maintain the display of the vector ¾ of the time and blank the vector for only ¼ of the time, to permit the operator to visually monitor the length of the blinking vector. As will suggest itself, other clock circuits may be utilized for generating the three clock signals CL1, CL2 and CL3.

Referring to FIG. 6, a preferred trapezoidal function generator 47 is illustrated as including operational amplifiers 59, 61 diodes D1–D4, resistors R4–R6 and capacitors C2, C3. Operational amplifier 59 receives clock signal CL1 for responsively controlling the conduction of a diode bridge 63 formed from diodes D1–D4. Resistors R4, R6 respectively connect plus 15 volts and minus 15 volts to opposite nodes 65, 67 of the diode bridge for producing a signal waveform at node 69 of the diode bridge as the bridge conducts. The signal waveform appearing at node 69 is illustrated in Graph B of FIG. 4, which is a periodic waveform of a repeated negative-going pulse and a positive-going pulse for respectively forming the ramp-up portion (a) and ramp-down portion (c) of the trapezoidal waveform of Graph A. Graphs C and D illustrate clock signals CL1 and CL2 in relation to Graphs A and B.

The voltage at node 69 is fed via a parallel connected resistor R5 and capacitor C3 to the inverting input of amplifier 61. Amplifier 61 has its output connected with a feedback path through a capacitor C2 forming an integrator circuit to generate the ramp portions of the trapezoidal waveform at the output of the amplifier 61. The output of amplifier 61 is fed back to the non-inverting input of amplifier 59 for comparison with the clock signal CL1 for controlling the switching of diode bridge 63.

An inverse waveform, −f(t), is generated from the waveform f(t) by feeding the output of amplifier 61 to an inverting circuit comprising an amplifier 71 and resistors R7–R9 connected as shown. The signals f(t) and −f(t) are transmitted to sin/cos function generator 49.

Function generator 49 comprises a conventional sin/cos potentiometer 73 which is constructed to receive inverse input signals at inputs 75, 77 for generating at output 79 the product signal of the cosine of an angle $\phi$ times the input signal at input 75 and generating at its output 81 the product signal of the sine of the angle $\phi$ times the input signal at input 75. Potentiometer 73 is manually operable for varying the angle $\phi$. The two (2) output signals f(t) cos $\phi$ and f(t) sin $\phi$ are fed to separate voltage follower amplifiers 83, 85 for impedance buffering.

Figure 7:
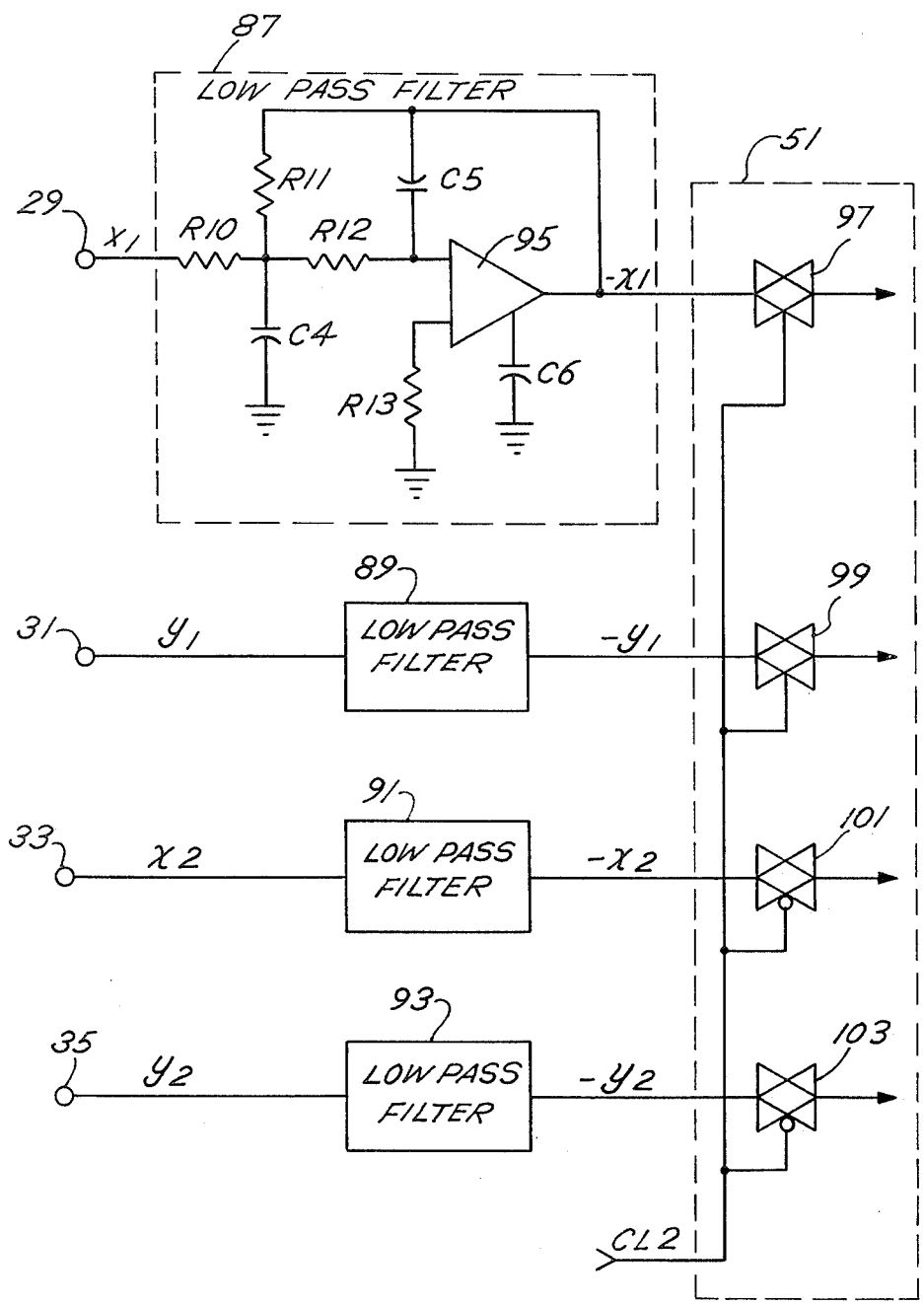
FIG. 7 is a preferred embodiment of filter circuits and switching logic of the control circuitry of FIG. 3.

Referring to FIG. 7, the voltages appearing at inputs 29–35 represent the Cartesian coordinates of the two vectors to be displayed. The voltages may be derived, for example, from conventional vibration transducers placed at separate locations on an automotive engine, or the like, for generating voltage signals representative of the forces at those locations. The magnitude of the vector represented by the x and y coordinate voltages may be calculated by conventional apparatus, as will be understood.

Where the voltage coordinate input signals appearing at inputs 29–35, are such as to carry noise and/or extraneous frequency signals as occurs with imbalance monitoring of automotive engines, the signals are filtered upon entering circuitry 27. Four multiple feedback filters 87, 89, 91, 93 are provided for filtering the input signals. A preferred embodiment of a filter is shown in more detail in diagram block 87 as including an op amp 95, resistors R10–R13 and capacitors C4–C6, connected as shown. The preferred filter serves to invert its input.

Coordinate signals $(-x_1, -y_1)$ and $(-x_2, -y_2)$ are passed from filters 87–93 to switching logic 51. Logic 51 comprises electronic gates 97, 99, 101, 103 for gating a single ordered pair of coordinate signals to rotational function generator 45. Electronic gates 97–103 are digitally controlled by clock signal CL2 for passing the voltage signals. When CL2 is high, gates 97, 99 are opened passing signals $-x_1$ and $-y_1$, and gates 101, 103 are closed. Conversely, when CL2 is low, gates 101, 103 are opened passing signals $-x_2$ and $-y_2$, and gates 97, 99 are closed.

Figure 8:
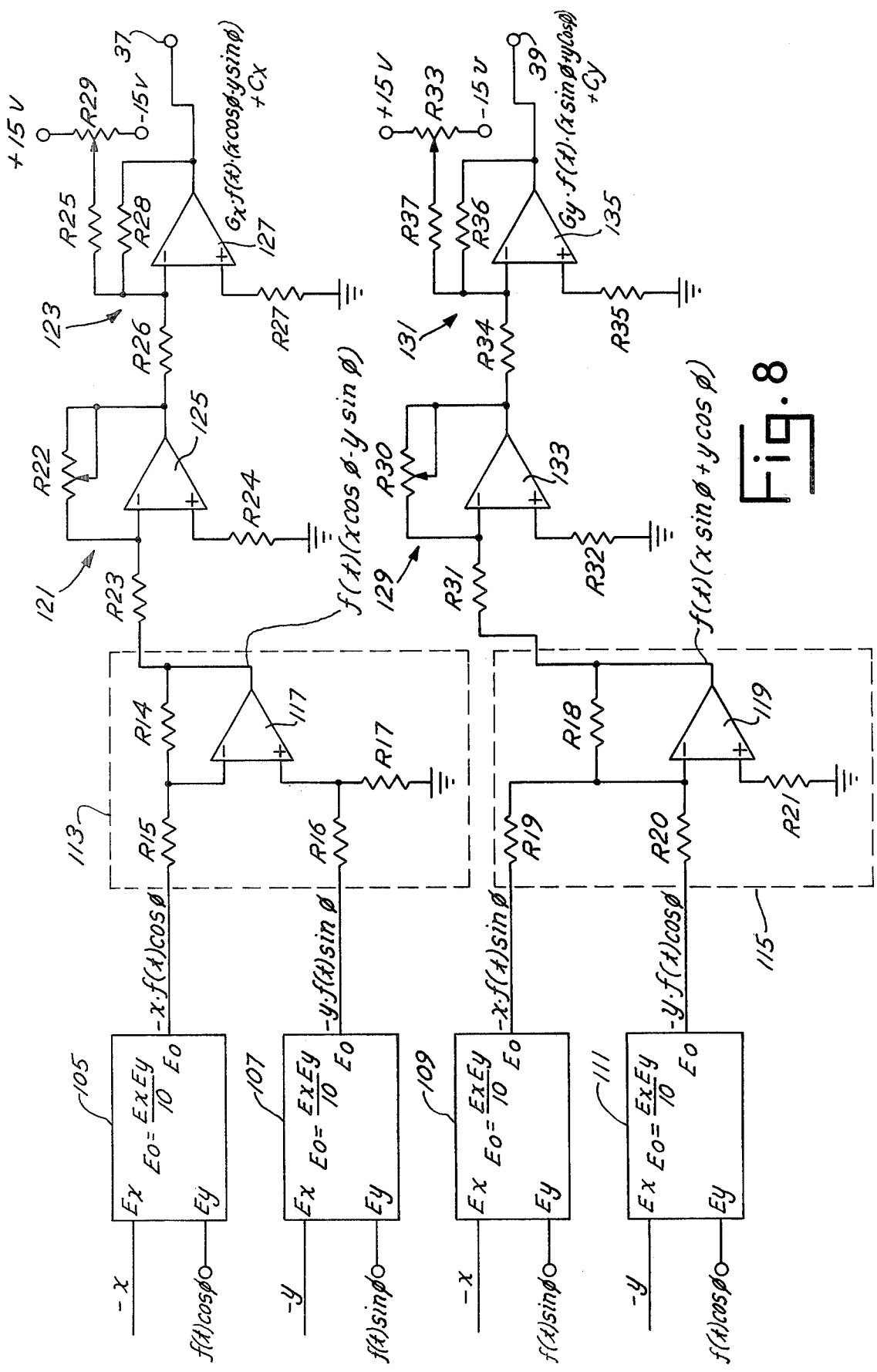
FIG. 8 is a preferred embodiment of the rotational function generator of the control circuitry of FIG. 3.

Referring to FIG. 8, a preferred rotational function generator 45 is illustrated as including four (4) function multipliers 105, 107, 109, 111 for multiplying each separate coordinate voltage by f(t) cos $\phi$ and f(t) sin $\phi$. The −x coordinate voltage is fed to multipliers 105, 109 for multiplication respectively with f(t)· cos $\phi$ and f(t)· sin $\phi$. The −y coordinate voltage is fed to multipliers 107, 111 for multiplication respectively with f(t)· sin $\phi$ and f(t)· cos $\phi$. The f(t)· cos $\phi$ and f(t)· sin $\phi$ signals are fed to the multipliers by sin/cos function generator 49.

The outputs of multipliers 105, 107 are fed to a function circuit 113 for generating the difference signal f(t)·(x cos $\phi$ − y sin $\phi$). Similarly, the outputs of multipliers 109, 111 are fed to a function circuit 115 for generating the summation signal f(t)·(x sin $\phi$ + y cos $\phi$). Function circuit 113 includes an op amp 117 and resistors R14–R17 connected as shown. Function circuit 115 includes an op amp 119 and resistors R18–R21.

The output of op amp 117 is fed to a horizontal gain circuit 121 and then to a horizontal positioning circuit 123 prior to transmission to input 37 of the oscilloscope. Horizontal gain circuit 121 includes an amplifier 125 and resistors R22–R24 connected as shown. Resistor R22 is a variable resistor for permitting the operator to adjust the extent of amplification (gain) of the output signal from op amp 117.

Horizontal position circuit 123 is constructed from an op amp 127 and resistors R25–R29, connected as shown. Resistor R29 is a variable resistor for adding a constant voltage, $C_x$, to the output signal of gain circuit 121 for horizontally adjusting the vectors with respect to the display screen.

The output of op amp 119 is fed to a vertical gain circuit 129 and a vertical positioning circuit 131 prior to transmission to y-input 39 of the oscilliscope. Vertical gain circuit 129 includes an op amp 133 and resistors R30–R32 connected as shown. Resistor R30 is a variable resistor for permitting the operator to adjust the extent of amplification (gain) of the output signal from op amp 119. The amplified signal from vertical gain circuit 129 is fed to vertical positioning circuit 131 which comprises an op amp 135 and resistors R33–R37, connected as shown. Resistor R33 is a variable resistor for controlling the addition of a constant voltage, $C_y$, to the output signal of gain circuit 129, for vertically adjusting the display vectors with respect to the display screen.

Referring to FIG. 9, a preferred dash generator 53 is illustrated as including four comparators 137, 139, 141, 143 and resistors R38–R54. Each of comparators 137–143 is connected at its non-inverting input to a respective one of resistors R38–R41 for receiving the output signal f(t) of trapezoidal function generator 47. A resistive voltage divider circuit comprising resistors R42–R50 provides a fixed fraction of a ten volt supply to each inverting input of the comparators 137–143 for generating 7.44 volts, 6.28 volts, 3.72 volts and 2.56 volts, respectively, at the inverting input of comparators 137–143.

As f(t) ramps from zero volts to ten volts, each of the outputs of comparators 137–143 sequentially goes to plus 10 volts until all comparators are at 10 volts. As f(t) falls, each comparator output sequentially turns off in reverse order.

A pair of exclusive OR gates 145, 147 receive the outputs from comparators 137–143 for generating an output to a NOR gate 149. The output signal DASH of NOR gate 149 is the output of the dash generator. A logical HIGH output from NOR gate 149 effectively turns ON the CRT beam, whereas a logical LOW output from NOR gate 149 effectively turns OFF the CRT beam. The output voltage of the dash generator is utilized to modulate the intensity control at Z input 41 of oscilloscope 25.

Figure 10:
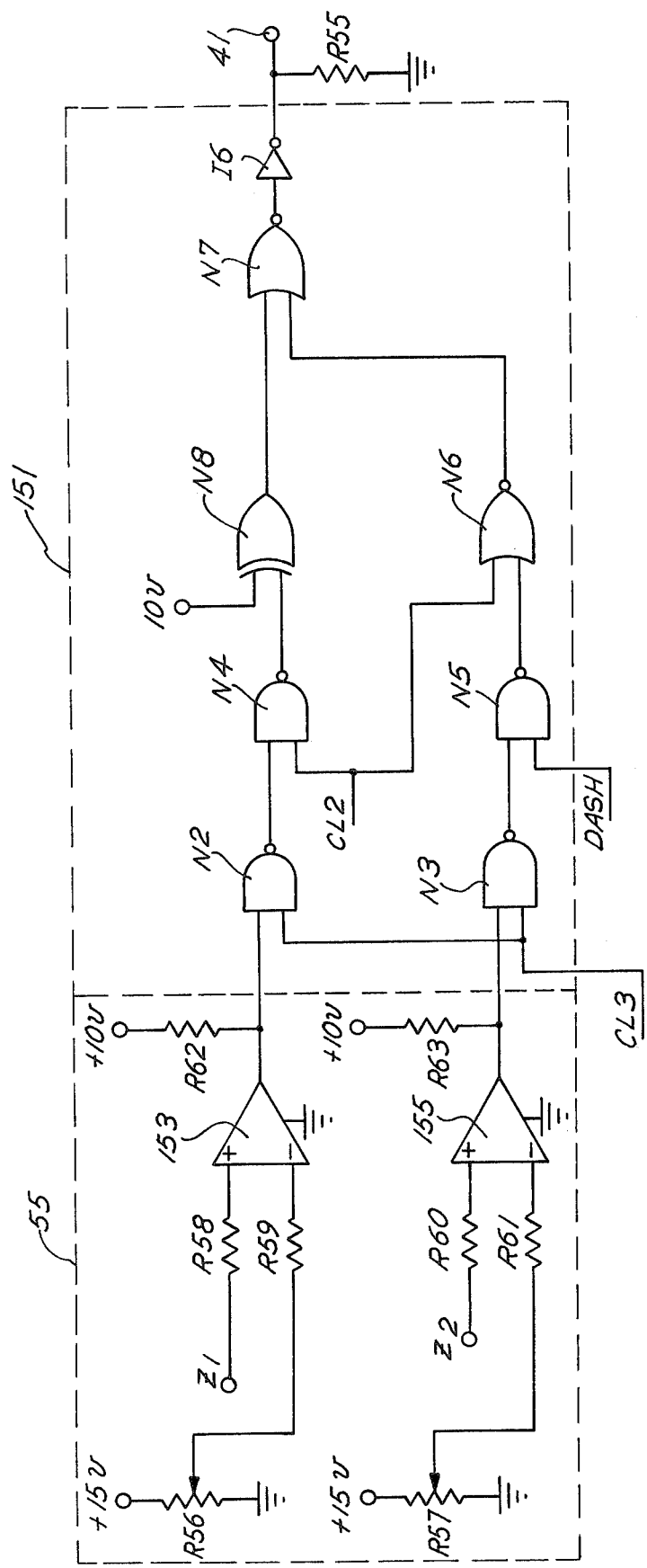
FIG. 10 is a preferred embodiment of the blink circuit of the control circuitry of FIG. 3.

Referring to FIG. 10, the signal DASH from dash generator 53 is fed to a blanking logic 151 together with output signals from a preferred blink circuit 55. Blanking logic 151 produces a voltage output across a resistor R55 for generating a voltage signal at the Z-input 41 of oscilloscope 25 for blanking the intensity of the CRT beam. A LOW logic signal from blanking circuit 151 blanks the display beam.

Blink circuit 55 includes a pair of comparators 153, 155 for monitoring respective voltage signals $Z_1$, $Z_2$ with respect to limit voltage levels developed across variable resistors R56, R57. The outputs of comparators 153, 155 are at a logical HIGH state when their respective Z signal is considered to be out-of-tolerance.

Blanking logic 151 comprises NAND gates N2–N5, NOR gates N6–N7, exclusive OR gate N8 and an inverter 16 connected as shown. Clock signal CL3 is fed to blanking logic 151 for gating the outputs of blink circuit 55 to intensity input 41 during the HIGH state of the clock signal CL3. Thus, Cl3 controls the rate of blinking. Clock signal CL2 is also fed to blanking logic 151 for controlling the dashing and blinking with respect to the appropriate displayed vector.

The following component values are given for the preferred embodiment.

CAPACITORS

C1—0.01 microfarads
C2—0.01 microfarads
C3—220 picofarads
C4—1.5 microfarads
C5—0.33 microfarads
C6—100 picofarads
R1—470 K ohms
R2—100 K ohms
R3—200 K ohms
R4—100 K ohms
R5—120 K ohms
R6—100 K ohms
R7-R8—20 K ohms
R9—10 K ohms
R10-R12—1.1 M ohms
R13—1.6 M ohms
R14-R20—10 K ohms
R21—3.32 K ohms
R22-R23—10 K ohms
R24—3.3 K ohms
R25-R26—100 K ohms
R27—33 K
R28—100 K
R29-R31—10 K
R32—3.3 K
R33—10 K
R34—100 K
R35—33 K
R36-R41—100 K
R42—22 K
R43—10 K
R44—22 K
R45—10 K
R46—22 K
R47-R50—100 K
R51-R57—10 K
R58-R61—100 K
R62-R63—10 K It should be understood, of course, that the foregoing disclosure relates to a preferred embodiment of the invention and that other modifications or alterations may be made therein without departing from the spirit or scope of the invention as set forth in the appended claims.

What is claimed is:

1. A vector display scope for visually displaying a vector wherein the vector is rotatable about its origin point via manual control by the user, comprising:
   means providing a pair of point signals defining a vector, one of said point signals having a magnitude representative of an X coordinate and the other of said point signals having a magnitude representative of a Y coordinate;
   signal generator means for generating a sweep signal as a function of time; said sweep signal having a continuous waveshape portion of a constant slope;
   sin/cos function generator means for generating a cosine signal functionally related to an angle $\phi$ and a sine signal functionally related to said angle $\phi$;
   control means manually operable for varying said angle $\phi$;
   rotational function generator means responsive to said cosine signal, said sine signal, said pair of point signals and said sweep signal for generating a first output signal representative of the product of the X coordinate location of said vector rotated through an angle $\phi$ and said sweep signal, and generating a second output signal representative of the product of the Y coordinate location of said vector rotated through the angle $\phi$ and said sweep signal; and
   display means responsive to said first and second output signals for displaying said vector rotated through said angle $\phi$.

2. A vector display scope for visually displaying a plurality of vectors wherein the vectors are rotatable about their origin point via manual control by the user, comprising:
   means providing a plurality of pairs of point signals defining a plurality of vectors, one of said point signals at each said pairs having a magnitude representative of an X coordinate of its respective vector and the other of said point signals of each said pairs having a magnitude representative of a Y coordinate of its respective vector;
   signal generator means for generating a periodic sweep signal as a function of time, said sweep signal having a continuous waveshape portion of a constant slope;
   sin/cos function generator means for generating a cosine signal functionally related to an angle $\phi$ and a sine signal functionally related to the angle $\phi$;
   control means manually operable for varying the angle $\phi$;
   rotational function generator means responsive to said cosine signal, said sine signal, and a pair of said point signals and said sweep signal for generating a first output signal representative of the product of the X coordinate location of the vector defined by said pair rotated through an angle $\phi$ and said sweep signal, and generating a second output signal representative of the product of the Y coordinate location of the vector defined by said pair rotated through the angle $\phi$ and said sweep signal;
   display means connected to said rotational function generator means for receiving said first and second output signals for displaying a said vector rotated through said angle $\phi$; and
   logic means for successively transmitting each of said pairs of point signals to said rotational function generator means for successively generating first and second output signals for successively displaying each of said plurality of vectors.

3. A vector display scope according to claim 2 and further including clock means for driving said signal generator means and said logic means at a rate for transmitting one of said pairs of point signals to said rotational function generator means during each period of said sweep signal.

4. A vector display scope according to claim 3 wherein said clock means generates a first clock signal and a second clock signal, the frequency of said first clock signal being an integer multiple of the frequency of said second clock signal; said first clock signal driving said signal generator means for producing said sweep signal and said second clock signal driving said logic means.

5. A vector display scope according to claim 2 wherein said sweep signal has a trapezoidal waveshape.

6. A vector display scope according to claim 2 and further including dash signal generator means for generating a blanking signal switching between a logical high state and a logical low state; and wherein said display means is responsive to one of said states of said blanking signal for blanking the intensity of the portion of a said vector being displayed during said one state.

7. A vector display scope according to claim 6 and further including clocking means driving said logic means and driving said dash signal generator means for blanking portions of every other vector displayed.

8. A vector display scope according to claim 2 and further including blinking signal generator means for generating a blinking signal responsive to a condition signal, said blinking signal switching between a logical high state and a logical low state; and means for generating a condition signal whenever the magnitude of a vector exceeds a predetermined maximum value; and wherein said display means is responsive to one of said states of said blinking signal for blanking the intensity of an entire vector displayed during said one state.

9. A vector display scope according to claim 8 wherein said blinking signal is in said one state three times as long as in the other of said states.

* * * * *